United States Patent [19]
Tanaka

[11] Patent Number: 5,874,190
[45] Date of Patent: Feb. 23, 1999

[54] PROCESS FOR PROJECTION EXPOSURE OF A WORKPIECE WITH BACK ALIGNMENT MARKS

[75] Inventor: Yoneta Tanaka, Yokohama, Japan

[73] Assignee: Ushiodenki Kabushiki Kaisha, Tokyo, Japan

[21] Appl. No.: 734,169

[22] Filed: Oct. 21, 1996

[30] Foreign Application Priority Data

Oct. 20, 1995 [JP] Japan ................................. 7-272374

[51] Int. Cl.⁶ ...................................................... G03F 9/00
[52] U.S. Cl. ............................................. 430/22; 356/401
[58] Field of Search ................................ 430/22; 356/401

[56] References Cited

U.S. PATENT DOCUMENTS

| | | |
|---|---|---|
| 3,709,579 | 1/1973 | Makosch . |
| 3,950,094 | 4/1976 | Kano et al. ................................. 355/45 |
| 4,798,470 | 1/1989 | Moriyama et al. ...................... 356/401 |
| 4,952,060 | 8/1990 | Ina et al. ................................. 356/401 |

FOREIGN PATENT DOCUMENTS 0 556 669  8/1993  European Pat. Off. .

OTHER PUBLICATIONS

Patent Abstracts of Japan, vol. 017, No. 525, (E–1436), Sep. 21, 1993 & JP 05 144702 A (Hitachi Ltd) Jun. 11, 1993, *Abstract, Figure 7*.

Patent Abstracts of Japan, vol. 013, No. 435, (E–825), Sep. 28, 1989 & JP 01 164032 A (Olympus Optical Co. Ltd.) Jun. 28, 1989, *Abstract*.

Patent Abstracts of Japan, vol. 016, No. 038, (E–1161), Jan. 30, 1992 & JP 03 246923 a (Hitachi Ltd.), Nov. 5, 1991, *Abstract*.

Patent Abstracts of Japan, vol. 009, No. 225, (E–342), Sep. 11, 1985 & JP 60 083329 A (Fujitsu KK), May 11, 1985, *Abstract*.

*Primary Examiner*—Christopher G. Young
*Attorney, Agent, or Firm*—Sixbey, Friedman, Leedom & Ferguson; David S. Safran

[57] ABSTRACT

A process for projection exposure in which, using alignment marks on the back of a workpiece, positioning of the mask to the workpiece is performed, and a device for executing the process is achieved by the fact that exposure light is emitted from an exposure light irradiation device without the workpiece being in place. Images of alignment marks of the mask are imaged on image sensors of alignment units, and by an image processing part positions thereof are determined. According to the invention, then, a workpiece is placed on a workpiece carrier, light is emitted from alignment light irradiation devices and positions of the alignment marks of the workpiece are determined. Furthermore, the workpiece carrier is moved by the carrier drive device such that the alignment marks of the mask and workpiece come to rest on top of one another, and thus positioning of the mask to the workpiece is done. Then the exposure surface of the workpiece and the imaging position of the mask are brought into agreement with one another, exposure light is emitted from the exposure light irradiation device, and the workpiece is exposed.

13 Claims, 5 Drawing Sheets

4 mask patternprojection surface
5 workpiece carrier
52 observation opening
6 alignment light irradiation device M mask
W wafer (workpiece)
WA alignment mark
MA mask alignment mark
61 condenser lens
62 half mirror
7 microscope objective lens
8 image sensor 4  mask pattern projection surface
5  workpiece carrier
52 observation opening
6  alignment light irradiation device L  optical component
M  mask
W  wafer (workpiece)
WA alignment mark
MA mask alignment mark
61 condenser lens
62 half mirror
7  microscope objective lens
8  image sensor ——— optical path when optical component L is removed
----- optical path when optical component L is inserted

PROCESS FOR PROJECTION EXPOSURE OF A WORKPIECE WITH BACK ALIGNMENT MARKS

BACKGROUND OF THE INVENTION

1. Field of the Invention

The invention relates to a projection exposure device which is used, for example, for production of a semiconductor device, a printed board, an LCD (liquid crystal display), and for similar purposes. The invention relates more specifically to a process for exposure in which positioning of alignment marks which are located on the back of a workpiece is performed relative to alignment marks of a mask, and in which projection exposure of a mask pattern onto the workpiece is produced. The invention also relates to a device for executing such a process.

2. Description of Related Art

In the production of a power transistor, micro machine, printed circuit board and the like, it is important to expose the pattern of a mask exactly in a predetermined position of a workpiece, such as a silicon wafer, epoxy resin and the like. The above described positioning is conventionally performed in such a way that the alignment marks of the mask and workpiece come to rest on top of one another. In particular, in a certain production process, there are cases in which the pattern is burned onto both sides of a workpiece, exact positioning of one pattern on the front side relative to the other pattern on the back being important.

This means that, in the formation of the back pattern, by turning over the workpiece with the pattern formed on its front and then exposing the back, it is necessary that alignment marks which are recorded on the front surface, on which the pattern is already formed and which are positioned by turning to the back relative to the surface exposed to the mask alignment marks, and that the pattern on the back be positioned relative to the pattern of the front. (In the following, this alignment is called back alignment).

In a process of manufacturing a micro machine, there is a need for accuracy of the above described positioning equal, for example, to roughly 1 micron.

The above described back alignment is conventionally used only for a proximity printing system in which the mask and the workpiece are caused to approach one another and exposure is produced. It is not used in a projection exposure system in which the mask pattern is projected onto the workpiece via a projection lens and exposure is performed.

The projection exposure system was conventionally used for working in the micro domain, such as formation of chips on a wafer surface, as in a reduction projection exposure device of the stepper type.

On the other hand, recently, exposure of both sides of the workpiece has been performed more and more often, as in a process of manufacture of a micro machine and the like. In this case, a double-side type of exposure is used more and more frequently in which, for example, one surface of the workpiece is subjected to precision processing by exposure by means of a stepper or the like, in which, then, the workpiece is turned, alignment of the second surface is performed using the alignment marks on the back surface and then exposure is performed.

To date, the proximity printing system as was described above was conventional as the exposure system for double-sided exposure by executing back alignment. In the proximity printing system, however, it was considered to be a disadvantage that impurities or the like which are formed on the workpiece and the mask cause faults, in this case, because the mask and the workpiece are caused to approach one another and exposure is done.

SUMMARY OF THE INVENTION

The invention was made with consideration of the above described disadvantages of the prior art.

Therefore, a first object of the invention is to devise a process for exposure in which, using alignment marks on the back of a workpiece and alignment marks of a mask, positioning of the mask relative to the workpiece is performed, and in which projection exposure of a mask pattern onto the workpiece can be produced, and a device for executing the process.

A second object of the invention is to devise a process for projection exposure in which automatic positioning of the alignment marks on the back of a workpiece relative to the alignment marks of a mask is performed, and in which projection exposure of a mask pattern onto the workpiece can be achieved, and a device for executing the process.

The above described objects are achieved according to the invention by the fact that, in a projection exposure device which has an exposure light irradiation device for emitting exposure light, a mask on which a mask pattern and alignment marks are recorded, a projection lens, a workpiece, on the back of one exposure surface of which alignment marks are recorded, and alignment determination systems for determining the positions of the above described alignment marks of the mask and the workpiece and for positioning of the two to one another, positioning of the mask to the workpiece is done in the manner described below in (1) to (5), and that projection exposure of the mask pattern onto the exposure surface of the workpiece is achieved.

The objects are achieved according to the invention furthermore by the projection exposure device being arranged in the manner described below in (6) and (7), by back alignment being performed, and by projection exposure of the mask pattern on the exposure surface of the workpiece being produced.

(1) Process for projection exposure according to solution 1 according to the invention:

(a) The positions of the alignment marks of the mask are determined in the state in which the workpiece is not yet present, and in which the imaging positions of the mask pattern and the alignment marks agree with the focal positions of the alignment determination systems.

(b) The positions of the alignment marks of the workpiece are determined in a state in which the workpiece is in place, and in which the alignment marks of the workpiece agree with the focal positions of the alignment determination systems.

(c) Positioning of the alignment marks of the mask relative to the alignment marks of the workpiece is produced.

(d) The exposure surface of the workpiece is brought into agreement with the imaging positions of the mask pattern and the alignment marks. The mask pattern is projected onto the workpiece from the exposure light irradiation device via the mask and the projection lens, and the workpiece is exposed.

(2) Process for projection exposure according to solution 2 according to the invention (a) Imaging positions of the mask pattern and the alignment marks are brought into agreement with the focal positions of the alignment determination systems, the workpiece not yet being present. Projection images of the alignment marks of the mask which are located in the above described imaging positions are picked up and subjected to image processing. Thus the positions of the alignment marks of the mask are determined and/or stored.

(b) The workpiece is placed and moved in a direction perpendicular to its exposure surface. The alignment marks of the workpiece are brought into agreement with the focal positions of the alignment determination systems. The positions of the alignment marks of the workpiece are determined and/or the images of the alignment marks are displayed.

(c) The workpiece is moved such that the alignment marks of the mask and the workpiece come to rest on top of one another.

(d) The exposure surface of the workpiece and the imaging position of the mask are brought into agreement with one another. The mask pattern is projected onto the workpiece from the exposure light irradiation device via the mask and the projection lens, and the workpiece is exposed.

(3) Process for projection exposure according to solution 3 according to the invention (a) The imaging positions of the mask pattern and the alignment marks are brought into agreement with the focal positions of the alignment determination systems, the workpiece not yet being present. Projection images of the alignment marks of the mask are picked up and subjected to image processing. Thus, the positions of the alignment marks of the mask are determined and/or stored.

(b) The workpiece is placed. The alignment determination systems are moved in the direction perpendicular to the workpiece exposure surface. The surface of the workpiece on which the alignment marks are recorded is brought into agreement with the focal positions of the alignment determination systems. The positions of the alignment marks of the workpiece are recorded and subjected to image processing. The positions of the alignment marks of the workpiece are determined and/ or images of the alignment marks are displayed.

(c) The workpiece is moved such that the alignment marks of the mask and the workpiece come to rest on top of one another.

(d) The exposure surface of the workpiece and the imaging position of the mask are brought into agreement with one another. The mask pattern is projected onto the workpiece from the exposure light irradiation device via the mask and the projection lens, and the workpiece is exposed.

(4) Process for projection exposure according to solution 4 according to the invention (a) The imaging positions of the mask pattern and the alignment marks, focal positions of the alignment determination systems and one surface of a workpiece carrier on which the workpiece is placed are brought into agreement with one another in the state in which the workpiece is not yet present. The projected images of the alignment marks of the mask are picked up and are subjected to image processing. Thus, the positions of the alignment marks of the mask are determined and/or stored.

(b) The workpiece is placed on the workpiece carrier. The positions of the alignment marks of the workpiece are picked up and subjected to image processing. The positions of the alignment marks of the workpiece are determined and/or the images of the alignment marks are displayed.

(c) The workpiece is moved such that the alignment marks of the mask and the workpiece come to rest on top of one another.

(d) The mask and/or the projection lens is/are moved in a direction perpendicular to the workpiece exposure surface. The exposure surface of the workpiece and the imaging position of the mask are brought into agreement with one another. The mask pattern is projected onto the workpiece from the exposure light irradiation device via the mask and the projection lens, and the workpiece is exposed.

(5) Process for projection exposure according to solution 5 according to the invention (a) The exposure surface of the workpiece is brought into agreement with the imaging position of the mask pattern and the alignment marks with one another. One surface of the workpiece on which the alignment marks are recorded, and the focal positions of the alignment determination systems are brought into agreement with one another. In the state in which the workpiece is not yet present, in the optical path between the projection lens and imaging positions of the projection images of the mask pattern and the alignment marks, position correction plates are inserted which move the imaging positions of the mask pattern and the alignment marks from their actual imaging positions by a length which corresponds to the thickness of the workpiece to be exposed. The projection images of the mask alignment marks are picked up and subjected to image processing. Thus, the positions of the alignment marks of the mask are determined and/or stored.

(b) The workpiece is placed. The positions of the alignment marks of the workpiece are picked up and subjected to image processing. The positions of the alignment marks of the workpiece are determined and/or the images of the alignment marks are displayed.

(c) The workpiece is moved such that the alignment marks of the mask and the workpiece come to rest on top of one another.

(d) The mask pattern is projected onto the workpiece from the exposure light irradiation device via the mask and the projection lens, and the workpiece is exposed.

(6) Device for projection exposure according to solution 6 according to the invention In a projection exposure device which has an exposure light irradiation device for emitting exposure light onto a mask, a mask carrier on which is placed a mask on which a mask pattern and alignment marks are recorded, a projection lens for projection of images of the mask pattern and of the alignment marks which are recorded on the mask, and a workpiece carrier on which a workpiece is placed, the workpiece carrier is provided with observation window parts for observation of alignment marks which are recorded on the back of the mask pattern projection surface of the workpiece. Furthermore, here, there are alignment determination systems for observing the alignment marks of the mask and workpiece opposite the observation window parts. The alignment determination systems determine the positions of the mask and workpiece alignment marks, and thus positioning of the mask alignment marks relative to the workpiece alignment marks is performed.

(7) Device for projection exposure according to solution 7 according to the invention There are an exposure light irradiation device for emitting exposure light onto a mask, a mask carrier on which is placed a mask on which a mask pattern and alignment marks are recorded, a projection lens for projection of images of the mask pattern and of the alignment marks which are recorded on the above described mask, a workpiece carrier on which a workpiece is placed and which is provided with an observation window parts for observation of alignment marks which are recorded on the back of the placed workpiece, an image processing means which subjects the mask and workpiece alignment marks recorded via the observation window parts to image processing and determines/stores the positions of the two alignment marks, and a control means. The image processing means determines and stores the positions of projected images of the mask alignment marks which are determined in the state in which the workpiece is not placed on the workpiece carrier. Furthermore, the image processing means determines the positions of the alignment marks which are recorded on the back of the workpiece and which are determined in the state in which the workpiece is placed on the workpiece carrier. The above described control means moves the workpiece carrier parallel to the exposure surface of the workpiece, such that the mask and workpiece alignment marks come to rest on top of one another. Thus, projection exposure of the mask pattern onto the workpiece is performed.

In the invention described above using solutions 1 through 5, the mask can be positioned relative to the workpiece with high precision using the alignment marks on the back of the workpiece and the mask alignment marks by the measure by which positioning of the mask alignment marks relative to the workpiece alignment marks is performed in the manner described above in (1) through (5) and by which projection exposure of the mask pattern onto the workpiece is achieved.

Furthermore, back alignment can be done without moving the workpiece and the like by the measure described above in (3) and (5), by which the alignment determination systems are moved in a direction perpendicular to the exposure surface of the workpiece, and in this way, the workpiece surface provided with the alignment marks is brought into agreement with the focal positions of the alignment determination systems, or by which the position correction plates are inserted and the imaging positions of the mask pattern and alignment marks are moved.

In the invention described using solutions 6 through 7, by means of the arrangement of the projection exposure device described above for (6) and (7), the alignment marks on the back of the workpiece can be observed via the observation window parts located in the workpiece carrier, and thus, back alignment can be produced with high precision using a device with a simple mechanism.

Furthermore, back alignment can be obtained automatically by the measure described above in (7), by which there are an image processing means and control means by which the positions of the projection images of the mask alignment marks are determined and stored by the image processing means, and furthermore, the positions of the alignment marks recorded on the back of the workpiece are determined, and by which the workpiece carrier is moved by the control means such that the mask and workpiece alignment marks come to rest on top of one another.

These and further objects, features and advantages of the present invention will become apparent from the following description when taken in connection with the accompanying drawings which, for purposes of illustration only, show several embodiments in accordance with the present invention.

DETAILED DESCRIPTION OF THE PREFERRED EMBODIMENTS

Figure 1:
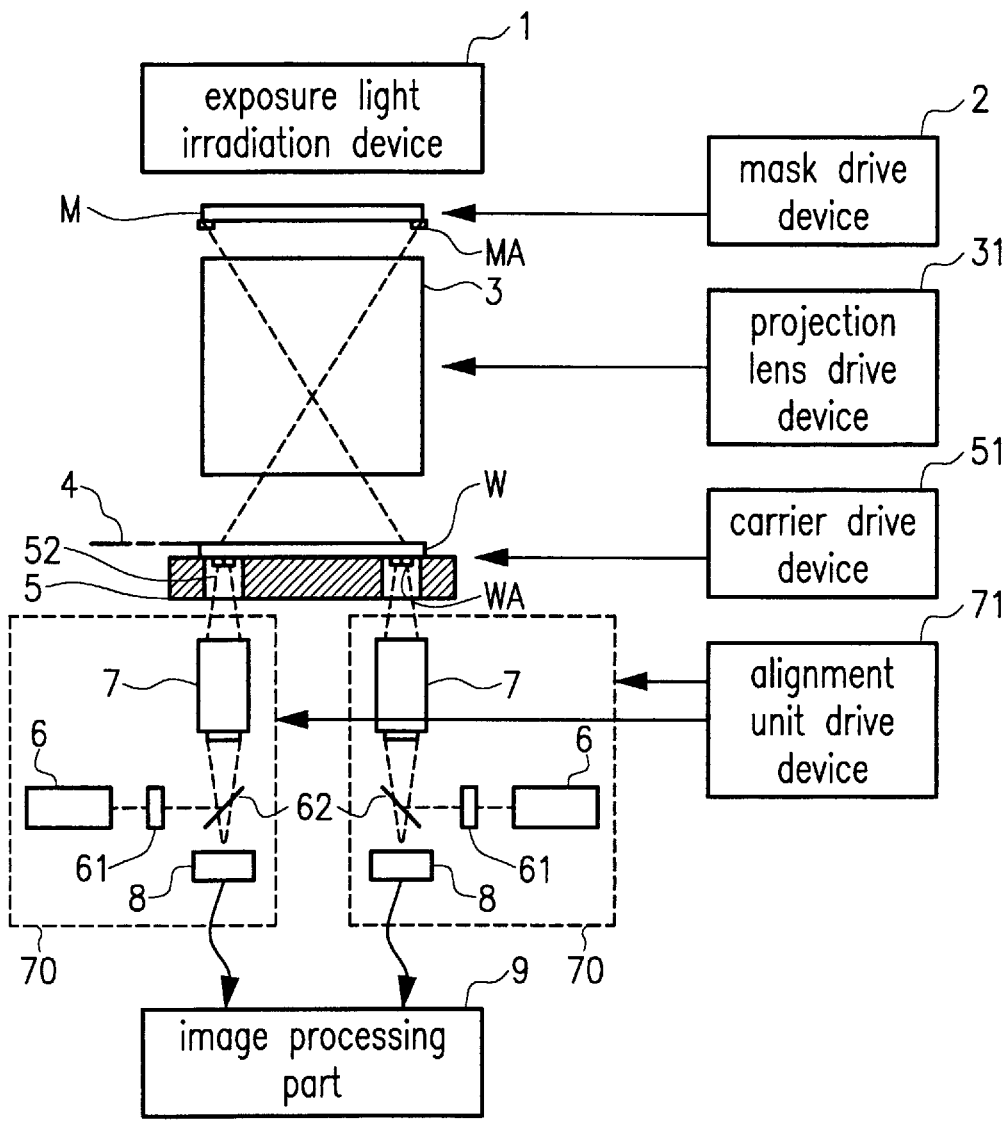
FIG. 1 is schematic depiction of a device for performing processes according a first and a second embodiment of the invention.

FIG. 1 shows the arrangement of an exposure device which is used for positioning a mask relative to a workpiece according a first and a second embodiment of the invention according to the invention. In the figure, numeral 1 designates an exposure light irradiation device which emits exposure light, for example, an i-line, an h-line and a g-line (i-line: 365 nm wavelength, h-line: 405 nm wavelength, g-line: 436 nm wavelength) onto a mask such that the illumination intensity on the surface of mask M becomes uniform. A pattern and alignment marks MA are recorded on mask M.

Figure 2:
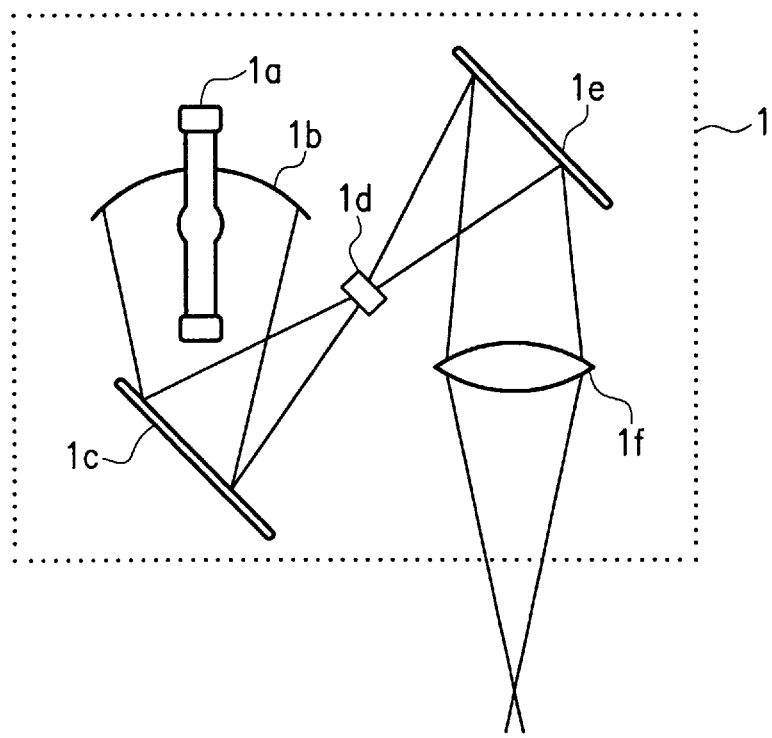
FIG. 2 shows a schematic of one example of an arrangement of an exposure light irradiation device.

As shown, for example in FIG. 2, the exposure light irradiation device 1 has a high pressure mercury lamp 1a as the light source in its interior. Light from the high pressure mercury lamp 1a is focussed by oval focussing mirror 1b and is emitted via flat reflector 1c, integrator lens 1d, flat reflector 1e and condenser lens 1f onto mask M.

In FIG. 1, reference number 2 designates a mask drive device which moves the position of mask M in the Z-direction (up and down in FIG. 1) and which also, for example at a preset of the mask M or the like, rotates the position of mask M around a straight line which is parallel to the exposure light axis (hereafter this rotation is called "motion in the θ direction"). Furthermore, mask drive device 2 moves the position of mask M in the X-Y directions (in two directions on one plane which orthogonally intersects the direction of the exposure light axis). Specifically, mask drive device 2 moves a conventional mask carrier (not shown) and which holds mask M securely in the above described manner, with which both manual control using a micrometer head and also automatic drive using a servomotor or the like can be utilized.

Additionally, a projection lens 3 projects the pattern and alignment marks MA on mask M onto a mask pattern projection surface 4. Reference number 31 indicates a projection drive device which moves a carrier (not shown) for positioning the projection lens in the Z-direction, with which both manual control using a micrometer head and also automatic drive using a servomotor or the like can be utilized.

A workpiece carrier 5 fixes wafer W (workpiece) in position, for example, by suction via a vacuum suction holder (not shown). Workpiece carrier 5, furthermore, has an observation openings 52 for observing the alignment marks WA which are recorded on the back of the wafer W. A carrier drive device 51 is provided for moving the workpiece carrier 5 in the X-Y-θ-Z directions, with which both manual control using a micrometer head and also automatic drive using a servomotor or the like can be utilized.

Reference number 6 indicates an alignment light irradiation device which irradiates alignment mark WA of the wafer W with light via a condenser lens 61, a half mirror 62 and an objective lens 7 through an observation opening 52.

Figure 3:
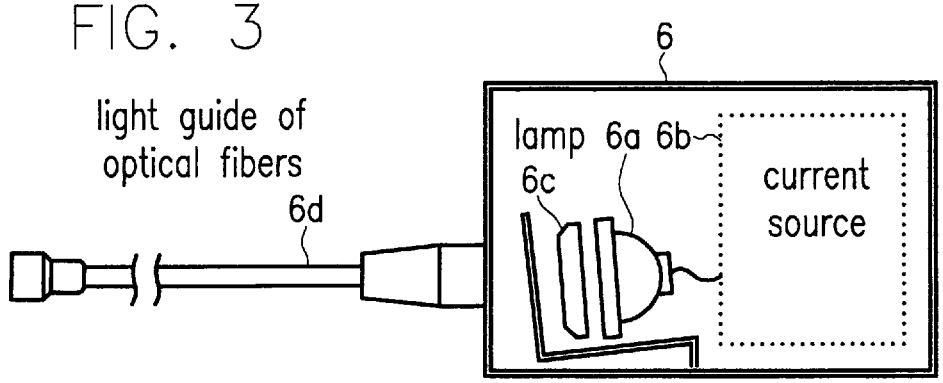
FIG. 3 shows a schematic of an alignment light irradiation device.

FIG. 3 is a schematic representation of one example for an arrangement of the alignment light irradiation devices 6 which has in its interior, a lamp 6a, such as a halogen lamp or the like, and a current source 6b for the lamp 6a. Light from lamp 6a is supplied via an infrared cut filter 6c and a light guide 6d composed of optical fibers to the condenser lens 61.

The light emitted from alignment light irradiation device 6 need not have a limited wavelength. However, in the case in which the mask pattern is exposed onto the back of wafer W, it is more advantageous to have nonexposure light emitted which, for example, does not contain i-line, h-line nor g-line light, each of which have an exposure wavelength.

In FIG. 1, reference number 8 indicates an image sensor which picks up the projected image of the alignment mark of mask M via the objective lens 7 as well as half mirror 62, if wafer W is not yet present on workpiece carrier 5. On the other hand, in the case in which wafer W is present on the workpiece carrier, it picks up the projected image of the wafer alignment mark by alignment light irradiation device 6 via objective lens 7 and half mirror 62.

Alignment unit 70 is formed of the objective lens 7 and the pertinent optical parts, for example, alignment light irradiation device 6, condenser lens 61, half-mirror 62 and image sensor 8 or the like. An alignment unit drive device 71 has the function of moving the alignment units 70 in the Z-direction.

This means that only when the objective lenses 7 move do the above described associated optical parts deviate from the optical paths of the images of the objective lenses 7, by which monitoring of the projected images by objective lenses 7 becomes no longer possible. The objective lenses 7 and the associated optical parts are, therefore, formed as units, as was described above, and are moved by means of alignment unit drive device 71. Furthermore, alignment unit drive device 71 can be subjected both to manual control and also automatic control, like the mask drive device 2. Reference number 9 indicates an image processing part which subjects the images of the alignment marks picked up by image sensors 8 to image processing.

Figure 4:
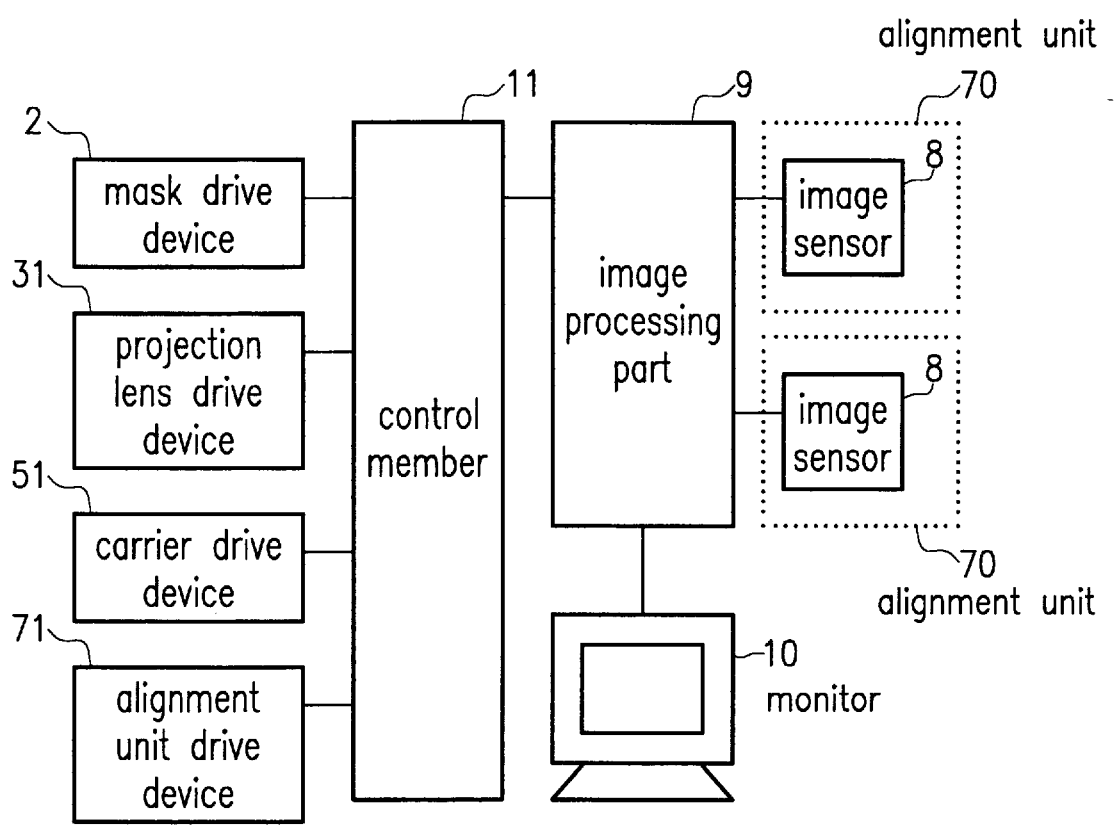
FIG. 4 is a schematic depiction of the arrangement of a control system for the invention.

FIG. 4 schematically shows the arrangement of a control system for automatically controlling of positioning/exposure in the first and second embodiment. As in FIG. 1, in FIG. 4, numeral 70 indicates the alignment unit, 9 the image processing part which receives images of the alignment marks MA from the image sensors 8, numeral 2 indicates the mask drive device for driving mask M in the X-Y-Z-θ directions, 31 the projection lens drive device for driving projection lens 3 in the Z-direction, 51 a carrier drive device for driving workpiece carrier 5 on which wafer W is placed in the X-Y-Z-θ directions, and 71 the alignment unit drive device for driving alignment units 70. In addition, a monitor is indicated by 10 and a control member by 11.

In the following, the alignment sequence in the first process embodiment of the invention is described with reference to the device shown in FIG. 1:

(1) Mask M is located in a predetermined position.

(2) Exposure light from exposure light irradiation device 1 is emitted onto mask M in the state in which wafer W is not yet present on workpiece carrier 5. The pattern and alignment marks MA of mask M are imaged by projection lens 3 onto the mask pattern projection surface 4. In this case, mask M and projection lens 3 are adjusted beforehand by means of mask drive device 2 and projection drive device 31, such that the mask pattern projection surface 4 and the surface of wafer W agree with one another.

(3) Using alignment unit drive device 71, objective lenses 7 are adjusted in the X-direction or Y-direction, such that the images of the alignment marks MA of mask M extend into the visual fields of the image sensors 8. Then, the objective lenses 7 are adjusted in the Z-direction such that the images of alignment marks MA of mask M are imaged on the image sensors 8. If this adjustment is done once, it need not be repeated if the mask M remains in place.

If the images of alignment marks MA of mask M are picked up by image sensors 8, the positions of alignment marks MA are determined and stored at image processing part 9. Often an image processing method, such as a "pattern search" based on pattern information recorded beforehand, feature extraction or the like is used for this determination.

In the case in which positioning is done not by automatic processing, but is performed manually by the operator, an image freeze unit is used and the recorded images of alignment marks MA are temporarily retained (if later the images of alignment marks WA of wafer W are picked up, the images of alignment marks WA of wafer W are placed on top of one another on the above described retained images of alignment marks MA of mask M and displayed).

Alternatively, a reference line is generated on the screen of the monitor 10 using reference lines generating unit, objective lenses 7 are moved by alignment unit drive device 71 and the images of alignment marks MA are brought into agreement with the reference lines (if later, the images of alignment marks WA of wafer W are picked up, wafer W is moved and the images of alignment marks WA of wafer W are brought into agreement with the noted reference lines). Other similar methods can also be used for this purpose. Determination of the above described "freeze" image can be done manually by the operator, or it can be automatically processed in a predetermined sequence.

(4) Irradiation of mask M with exposure light from exposure light irradiation device 1 is stopped.

(5) Wafer W is placed on workpiece carrier 5. The back or the front and back sides of wafer W are provided with alignment marks WA beforehand. The term "back" here is defined as the side which is faces away from the mask M. The position of wafer W is preset by engaging it against a positioning means located on the workpiece carrier 5, for example, a positioning pin or the like. Alignment marks WA on the back of wafer W are, therefore, positioned in the vicinity of observation opening 52.

(6) From alignment light irradiation devices 6 light is radiated which is emitted onto the back of wafer W through observation opening 52 of workpiece carrier 5. In doing so, it is more advantageous that nonexposure light is emitted from alignment light irradiation devices 6 which light contains, for example, neither i-line, h-line nor g-line light, each of which have an exposure wavelength, in the case in which a light-sensitive agent is applied to the back of wafer W.

(7) Mask pattern projection surface 4 and image sensors 8 are at an imaging ratio to one another produced by objective lenses 7. Workpiece carrier 5 is, therefore, moved by carrier drive device 51 in the Z-direction such that the images of alignment marks WA on the back of wafer W are imaged on the image sensors 8.

In doing so, instead of moving the workpiece carrier 5 in the Z-direction, alignment units 70 can be driven by alignment unit drive device 71, can move objective lenses 7 in the Z-direction, and bring the back of wafer W and image sensors 8 into an imaging ratio to one another.

The above described adjustment can be performed automatically by controlling the workpiece carrier drive device 71 by control member 11 shown in FIG. 4. However, it can also be performed manually by watching the screen of the monitor 10.

(8) Next, the alignment marks WA of workpiece W are picked up by the image sensors 8 and determined at the image processing part 9. Workpiece carrier 5 is moved by means of the carrier drive device 51 in the X-direction, Y-direction or θ-direction, such that alignment marks MA of the mask and the alignment marks WA on the back of wafer W, which were determined and stored at the start, come to rest on top of one another.

This positioning is done automatically, as was described above, by workpiece carrier drive device 51 being controlled by control member 11 moving workpiece carrier 5 in the X-Y-θ directions, such that the positions of the alignment marks MA of the mask M stored and determined by the image processing part 9 agree with the positions of alignment marks WA of the wafer W.

Furthermore, as was described above, the image freeze unit stores the images of the alignment marks MA of the mask, alignment marks WA of wafer W are displayed on monitor 10, the above-described retained images of the alignment marks MA of mask M are placed on top of one another on the images of the alignment marks WA of the wafer W and are displayed, and thus, manual positioning is achieved. Alternatively, manual positioning can also be performed by bringing the reference line generated by the reference line generating unit into agreement, beforehand, with the positions of the alignment marks MA of the mask M, and by alignment marks WA of wafer W being brought into agreement with this reference line.

(9) In the case in which, in above described step (7), the workpiece carrier 5 was moved in the Z-direction, mask pattern projection surface 4 and the back of wafer W agree. Workpiece carrier 5, therefore, is moved using the carrier drive device by the same amount as the amount of movement in step (7) but in the opposite direction. Thus, the surface of the wafer W and the mask pattern projection surface 4 are brought into agreement with one another.

Positioning of mask M relative to wafer W and preparation for exposure are completed with the above described sequence.

(10) Exposure light is emitted onto mask M from exposure light irradiation device 1. The mask pattern is projected onto wafer W and thus wafer W is exposed.

In the case in which the above described positioning is performed, and in which, after completion of exposure, the next wafer W is placed and positioned, it is afterwards unnecessary to adjust the positions of mask M, projection lens 3 and objective lenses 7. Therefore, only above described positioning steps (5), (6), (7), (8), (9) and (10) need be done.

But, in the case in which, as a result of changes of ambient temperature, the positions of mask M and projection lens 3 change, it is necessary to again perform above described steps (2), (3) and (4), since the positions of mask pattern projection surface 4 and alignment marks MA change.

In steps (3) and (7), in this embodiment, the positions of objective lenses 7 are adjusted using alignment unit drive device 71, such that the images of the alignment marks MA of mask M are imaged on the image sensors 8. However, an image sensor drive device for driving image sensors 8 can also be utilized to adjust the positions of image sensors 8, while objective lenses 7 remain fixed, and thus, the images of the alignment marks MA of the mask M can be imaged on image sensors 8.

As was described above, in this embodiment, back alignment can be performed automatically with high precision by the measure in which the workpiece carrier 5 is provided with observation openings 52 for observing the alignment marks WA on the back of wafer W, in which the back of wafer W is aligned relative to the alignment units 70, in which the projected images of alignment marks MA of mask M and the alignment marks WA on the back of wafer W are picked up through the observation opening 52 by means of the alignment units 70, and in which positioning of the two relative to one another is achieved.

Instead of moving wafer W in the Z-direction, in above described step (7), the alignment units 70 can be driven by means of alignment unit drive device 71, objective lenses 7 can be moved in the Z-direction and the back of wafer W and image sensors 8 can be brought into an imaging ratio with respect to one another. For this reason, a device for moving the wafer W in the Z-direction is no longer necessary.

In the following, the alignment sequence in accordance with a second process embodiment of the invention is described with reference to the device shown in FIG. 1:

In this embodiment, using mask drive device 2 and projection lens drive device 31, the mask pattern projection surface 4 and the back of wafer W are brought into agreement with one another. Otherwise, this embodiment is essentially identical to the first embodiment.

(1) Mask M is located in a predetermined position.

(2) Alignment light from alignment light irradiation device 1 is emitted onto mask M prior to placing of the wafer W on the workpiece carrier 5. The pattern and alignment marks MA of the mask M are imaged by projection lens 3 onto mask pattern projection surface 4.

(3) Using mask drive device 2 and projection lens drive device 31, the mask M and the projection lens 3 are moved in the Z-direction. Thus, the mask pattern projection surface 4 and the back of wafer W are brought into agreement with one another.

(4) Objective lenses 7 are adjusted in the X-direction or Y-direction and then in the Z-direction, such that the images of the alignment marks MA of the mask M are imaged on the image sensors 8. If this adjustment has been done once, it need then not be repeated if the mask M remains in place.

If the images of alignment marks MA of mask M were picked up by image sensors 8, the positions of alignment marks MA are determined and stored at image processing part 9. Often, an image processing method, such as a "pattern search" based on pattern information recorded beforehand, feature extraction or the like is used for this determination.

In the case in which positioning is performed manually by the operator instead of by automatic processing, an image freeze unit is used or the reference line generation unit is used, as was described above.

(5) Irradiation of mask M with exposure light from exposure light irradiation device 1 is stopped.

(6) Wafer W is placed on workpiece carrier 5. The back side or the front and back sides of wafer W having alignment marks WA which were applied beforehand. The term "back" here is defined as the side which faces away from mask M.

The position of the wafer W is preset by engaging it against a positioning means located on workpiece carrier 5, for example, a positioning pin or the like. Alignment marks WA on the back of workpiece W are, therefore, positioned in the vicinity of observation openings 52.

(7) Light is irradiated from alignment light irradiation devices 6 and is emitted onto the back of wafer W through observation openings 52 of workpiece carrier 5. In doing so, it is more advantageous that the light emitted from the alignment light irradiation devices 6 is nonexposure light which, for example, contains neither i-line, h-line nor g-line light, each of which has an exposure wavelength, in the case in which a light-sensitive agent is applied to the back of wafer W.

(8) Image sensors 8 are brought to an imaging ratio with respect to each other and mask pattern projection surface 4, i.e., with the back of wafer W, by objective lenses 7. Alignment marks WA of wafer W are, therefore, picked up by image sensors 8 and determined at image processing part 9. Workpiece carrier 5 is, therefore, moved by carrier drive device 51 in the X-direction, Y-direction or θ-direction such that the alignment marks MA of the mask and the alignment marks WA on the back of wafer W which were determined and stored beforehand come to rest on top of one another.

This positioning is done automatically by workpiece carrier drive device 51 controlled by control member 11 moving workpiece carrier 5 in the X-Y-θ directions, as was described above.

Furthermore, as was also described above, manual positioning can also be performed by means of the image freeze unit and the reference line generation unit.

(9) Mask pattern projection surface 4 and the back of wafer W agree with one another. Mask M or projection lens 3 is, therefore, moved in a direction opposite to the direction of movement in above described step (3) by the same amount as the thickness of wafer W using mask drive device 2 or projection lens drive device 31. Thus, the mask pattern projection surface 4 and the surface of wafer W are brought into agreement with one another.

Positioning of mask M relative to wafer W and preparation for exposure are completed with the above described sequence.

(10) Exposure light is emitted onto mask M from exposure light irradiation device 1. The mask pattern is projected onto wafer W, and thus, wafer W is exposed.

In the case in which the above described positioning is performed, and in which, after completion of exposure, the next wafer W is placed and positioned, it is afterwards unnecessary to adjust the positions of objective lens 7. Therefore only above described positioning steps (6), (7), (8), and (10) need be done.

But, in the case in which, as a result of changes of ambient temperature, the positions of mask M and projection lens 3 change, it is necessary to again perform the steps (2), (3), (4), (5) and (9) as was described above. As was also described above, in this embodiment, the same effects as in the first embodiment can be obtained by the measure by which mask M and projection lens 3 are moved in the Z-direction, by which the surface of wafer W provided with alignment marks WA and the surface on which alignment marks MA of mask M are imaged are brought into agreement with one another beforehand, by which the alignment marks MA of the mask M are stored, by which then wafer W is moved such that alignment marks WA of wafer W and the above stored positions of alignment marks MA of mask M come to rest on top of one another. Furthermore, it is unnecessary to additionally position a device for moving wafer W in the Z-direction.

Figure 5:
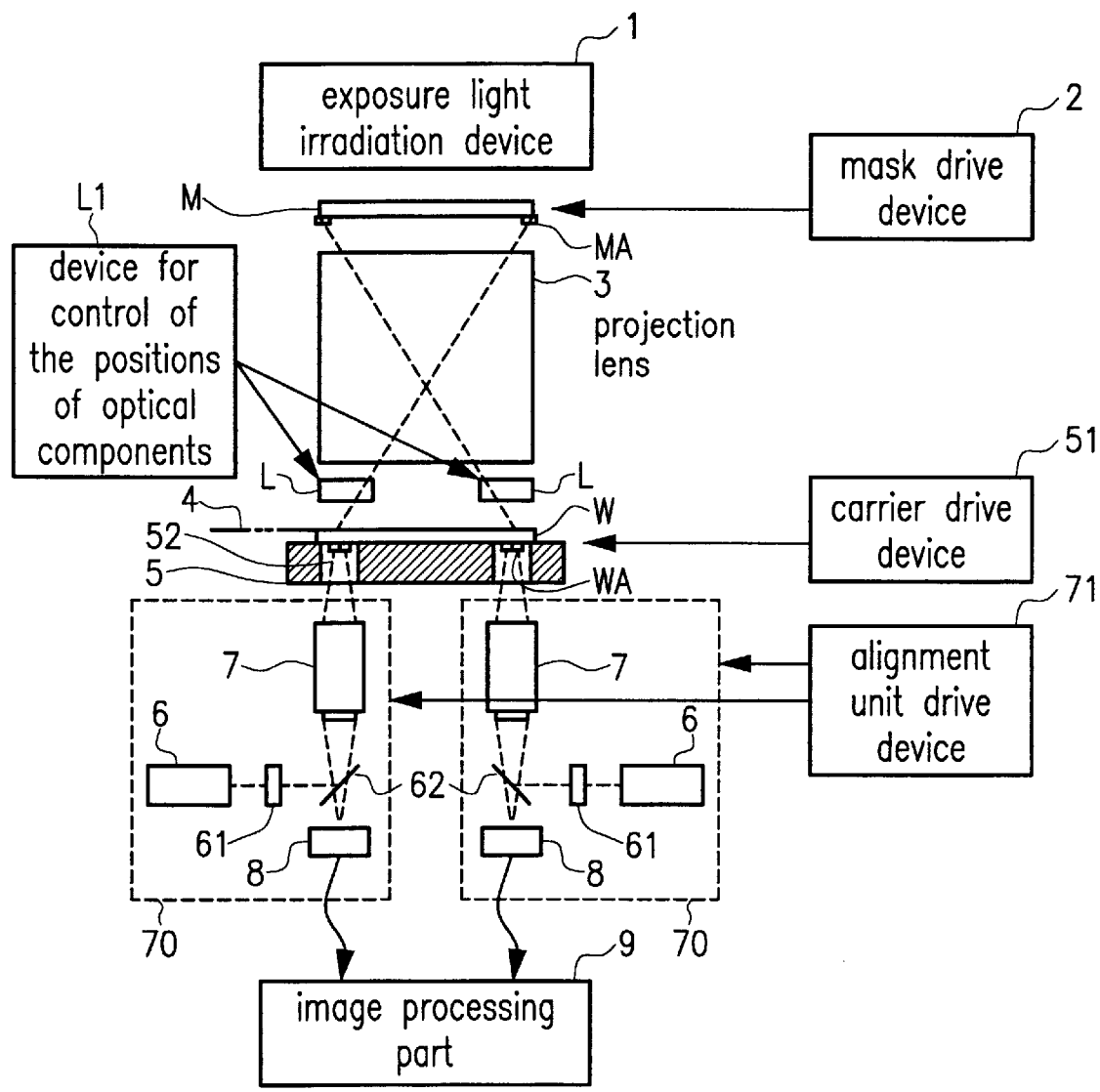
FIG. 5 schematically depicts a device for performing a third process embodiment of the invention.

FIG. 5 is a schematic of a device for performing a third process embodiment of the invention. In this embodiment, using optical components, the workpiece surface provided with alignment marks WA and the projection surface of the alignment marks MA of the mask are brought into agreement with one another.

In the following, the third process embodiment of the invention is described with reference to FIG. 5:

In the drawing parts with the same functions as in FIG. 1 are labelled with the same reference numbers as in FIG. 1. Specifically, reference numeral 1 designates the exposure light irradiation device, reference numeral 2 the mask drive device, 3 the projection lens, 4 the mask pattern projection surface, 5 the workpiece carrier and 52 the observation opening. Furthermore, 6 is the alignment light irradiation device, 61 a condenser lens, 62 the half mirror and 7 the objective lens. Alignment unit 70 is formed from the objective lens 7 and the associated optical parts, such as, for example, alignment light irradiation device 6, condenser lens 61, half mirror 62, image sensors 8 or the like. Alignment units 70 are driven by alignment unit drive device 71. Reference numeral 9 indicates the image processing part which subjects the alignment mark images picked up by image sensors 8 to image processing.

Carrier drive device 51, in this embodiment, executes linear motion or rotation of the position of workpiece carrier 5 in the X-Y directions. However, it need not move the workpiece carrier 5 in the Z-direction, as in the first embodiment.

Figure 6:
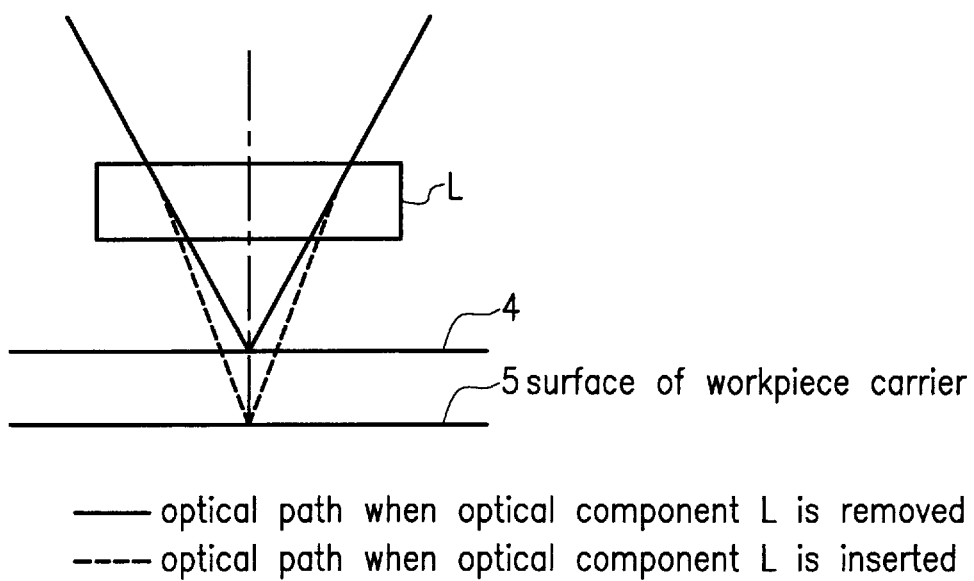
FIG. 6 depicts the optical paths when an optical component is inserted and removed.

In contrast to the FIG. 1, embodiment, an optical component L, in the form of a parallel flat plate. Optical components L, as shown in the drawing, are inserted into and removed from the optical paths in which alignment marks MA of mask M are imaged by projection lens 3 onto mask pattern projection surface 4. The insertion positions are located between projection lens 3 and mask pattern projection surface 4. When optical components L are inserted, the imaging positions of the projection images of alignment marks MA of the mask M on mask pattern projection surface 4 move in the Z-direction, as is shown in FIG. 6 using the broken lines.

As was described above, the exposure light emitted from exposure light irradiation device 1 travels through optical components L. Therefore, a glass material is desirable for this purpose which has a high transmission factor of light with exposure light wavelengths (for example, the i-line, h-line and g-line light) and which has a slight change of the transmission factor over time. Specifically, quartz glass, soda lime glass, crown glass or the like is selected as the glass material.

Thickness d of the optical components L is computed according to the following formula, when the index of refraction of the glass material used is designated n and the thickness of the wafer (workpiece) dw:

$$d=dw/(1-(1/n))=(n/(n-1))dw$$

A optical component position controlling device L1 controls the positions of the optical components, inserting the optical components L into and removing them from the optical paths in which the alignment marks MA of the mask M are imaged by projection lens 3 onto the mask pattern projection surface 4. For insertions, optical component position controlling device L1 produces linear motion and rotary motion of optical components L in the X-Y-Z directions.

This means that the optical component position controlling device L1 has the functions both of insertion and removal of the optical components L as well as the function of adjustment of the insertion positions. The two functions are independent of one another. If, on the one hand, the insertion positions have been set, these insertion positions do not change, even if insertion and removal of optical components L are repeated.

Specifically, optical component position controlling device L1, for example, the carriers (not shown) which fix optical components L in position in the above described manner. In this case, both manual control using a micrometer head or the like and also automatic control using a servomotor or the like can be performed.

In this embodiment, the control system shown above in FIG. 4 can be used for automatic control of positioning/exposure. In this embodiment, an arrangement can be provided in which the FIG. 4 control member 11 controls the optical component position controlling device L1 instead of projection lens drive device 31.

Next, the alignment sequence in the exposure device according to the third embodiment of the invention is described:

(1) Wafer W or a reference workpiece with a back provided with alignment marks WA is placed on workpiece carrier 5. Light is emitted from alignment light irradiation devices 6. Wafer W, or the workpiece used as a reference, is pushed against a positioning means located on workpiece carrier 5, such as a positioning pin or the like, and is thus preset. Alignment marks WA on the back of wafer W are therefore positioned in the vicinity of observation openings 52.

Light is radiated onto the back of wafer W, or the workpiece used as the reference, through observation openings 52 of workpiece carrier 5. In doing so, it is more advantageous that from nonexposure light is emitted from the alignment light irradiation devices 6 which light, for example, contains neither the i-line, g-line nor h-line, each of which have an exposure wavelength, in the case in which a light-sensitive agent is applied to the back of wafer W.

(2) Using alignment unit drive device 71, the objective lenses 7 are adjusted in the X-direction or Y-direction, such that the images of the alignment marks WA on the back of wafer W or the reference workpiece are imaged on the image sensors 8, and that the images of the alignment marks WA extend into the visual fields of image sensors 8. Then, the objective lenses 7 are adjusted in the Z-direction, such that the images of the alignment marks WA are imaged on image sensors 8.

The positions of objective lenses 7 are adjusted by the above described activation. This adjustment need only be done once. Alignment marks WA were used above to adjust the positions of objective lenses 7. However, there is no need to be limited to alignment marks WA, and other suitable patterns can be used which can be observed through observation openings 52.

(3) Emission of light from alignment light irradiation devices 6 is stopped. Wafer W or the reference workpiece is removed from workpiece carrier 5.

(4) Irradiation of mask M with exposure light from exposure light irradiation device 1 is started.

(5) Optical components L are inserted into the space between projection lens 3 and mask pattern projection surface 4 by optical component position controlling device L1. Optical parts L, as shown in FIG. 6, move the imaging positions of alignment marks MA of mask M on mask pattern projection surface 4 in the Z-direction when they are inserted.

(6) The insertion positions of optical components L are set by optical component position controlling device L1. When optical components L are inserted, they must unconditionally be inserted in the optical paths of the projection images of alignment marks MA of the mask M.

This adjustment need no longer be done afterwards if the positions of alignment marks MA do not change.

By inserting optical components L, the images of the alignment marks MA of mask M are projected in the vicinity of the positions in which alignment marks WA on the back of wafer W or the reference workpiece in above described step (2) were present. They are, therefore, imaged via objective lenses 7 and half mirrors 62 in image sensors 8.

(7) If, by means of image sensors 8, the images of the alignment marks MA of mask M were picked up, the positions of the alignment marks MA are determined and stored at image processing part 9.

Often, an image processing method, such as a "pattern search" based on pattern information recorded beforehand, feature extraction or the like is used for this determination.

In the case in which positioning is performed manually by the operator instead of by automatic processing, an image freeze unit can be used or a reference line generating unit can be used, as was described above.

(8) Irradiation of light onto mask M from exposure light irradiation device 1 is stopped.

(9) Optical components L are removed from the space between the projection lens 3 and the mask pattern projection surface 4 by the optical component position controlling device L1. In the case in which optical components L do not screen the optical path of the projected images of the mask pattern, it is not necessary to remove them from the above described space.

(10) Wafer W, as the workpiece to be exposed, is placed in a predetermined position on workpiece carrier 5. For example, wafer W is pushed against a positioning means, such as a positioning pin or the like, located on workpiece carrier 5, and is thus preset. Alignment marks WA on the back of wafer W are, therefore, positioned in the vicinity of the observation openings 52.

(11) Light is radiated from alignment light irradiation devices 6. The light is radiated onto the back of the wafer W through the observation openings 52 of the workpiece carrier 5. In doing so, it is more advantageous that nonexposure light is emitted from alignment light irradiation devices 6 which, for example, does not contain the i-line, h-line nor g-line light, each of which have an exposure wavelength, in the case in which a light-sensitive agent is applied to the back of wafer W.

(12) Alignment marks WA of wafer W which are determined at image processing part 9 are picked up by image sensors 8. Workpiece carrier 5 is moved by means of carrier drive device 51 in the X-direction, Y-direction or $\theta$-direction, such that the alignment marks MA of mask M and alignment marks WA on the back of wafer W, which were determined and stored at the start, come to rest on top of one another.

This positioning is done automatically, as was described above, by workpiece carrier drive device 51 controlled by control member 11 moving workpiece carrier 5 in the X-Y-$\theta$ directions.

Positioning by the image freeze unit or the reference line generation unit can also be done manually, as was described above.

Positioning of mask M relative to wafer W and preparation for exposure are completed with the above described sequence.

(13) Exposure light from exposure light irradiation device 1 is emitted onto mask M. The mask pattern is projected onto the wafer, and thus wafer W is exposed.

In the case in which the above described positioning is performed, and in which, after completion of the above described positioning, the next wafer W is placed and positioned, it being unnecessary to adjust the positions of objective lenses 7 and the insertion positions of optical parts L. Therefore, only above described positioning steps (10), (11) and (12) need be performed.

However, in the case in which, as a result of changes of the ambient temperature, the positions of mask M and projection lens 3 change, it is necessary to again perform the above described steps (4), (5), (6), (7), (8) and (9).

As was also described above, in this embodiment, the same effects as in the first and second process embodiments can be obtained. Here, it is not necessary that carrier drive device 51 have the function of moving workpiece carrier 5 in the Z-direction due to the measure by which optical components L are inserted and removed, by which the imaging position of alignment marks MA of the mask are moved, and by which the surface of wafer W provided with alignment marks WA is brought into agreement with projection surface 4 of alignment marks MA of mask M. Moreover, the surface of workpiece W provided with alignment marks WA can be brought into agreement with projection surface 4 of alignment marks MA of mask M by simple activation.

In the above described third embodiment, optical components L are inserted into the space between projection lens 3 and the mask pattern projection surface 4, and the imaging positions of alignment marks MA of mask M are moved in the Z-direction. However, the back of wafer W and image sensors 8 can be brought into an imaging ratio relative to one another by the fact that, in the first embodiment, optical components L are inserted between wafer W and objective lens 7 and removed, and that optical components L move the observation surfaces of objective lenses 7 in the Z-direction.

This means that, in the above described first embodiment in step (3), optical components L are inserted, and using the alignment unit drive device 71, the objective lenses 7 are moved in the X-direction, Y-direction or Z-direction, such that the images of alignment marks MA of mask M are imaged on image sensors 8.

After steps (4) through (7) have been completed, in step (8), the above described optical components L are removed. In this way, the back of wafer W and image sensors 8 can be brought into an imaging ratio relative to one another without moving the objective lenses 7 in the Z-direction.

By means of the above described measure, it is unnecessary to move workpiece carrier 5 in the Z-direction or to move objective lenses 7. Therefore the device can be simplified and activation facilitated.

Action of the Invention

As was described above, according to the invention, the following effects can be obtained.

(1) Positioning of the mask can be obtained with high precision using the alignment marks on the back of the workpiece and the alignment marks of the mask by the measure by which the positions of the alignment marks of the mask are determined in the state in which the workpiece is not in place, and in which the imaging positions of the mask pattern and the alignment marks agree with the focal positions of the alignment determination systems, by which, then, the positions of the alignment marks of the workpiece are determined in the state in which the workpiece is in place, and in which the alignment marks of the workpiece agree with the focal positions of the alignment determination systems, by which positioning of the alignment marks of the mask relative to the alignment marks of the workpiece is performed, by which the exposure surface of the workpiece, then, is brought into agreement with the imaging positions of the mask, by which the mask pattern is projected onto the workpiece from the exposure light irradiation device via the mask and the projection lens, and by which the workpiece is exposed.

(2) Back alignment can be performed without moving the workpiece or the like by the measure by which, in above described step (1), the alignment determination systems are moved in a direction perpendicular to the workpiece exposure surface, by which the surface of the workpiece on which the alignment marks are recorded is thus brought into agreement with the focal positions of the alignment determination systems, or by which the imaging positions of the mask pattern and the alignment marks are moved by inserting and removing position correction plates.

(3) Back alignment can be performed with high precision with a simple arrangement by the measure by which, in a projection exposure device which has an exposure light irradiation device, a mask carrier on which is placed a mask on which a mask pattern and alignment marks are recorded, a projection lens and a workpiece carrier on which a workpiece is placed, on the back of which (with respect to the mask patter projection surface), alignment marks are recorded, the workpiece carrier is provided with an observation window parts for observing the alignment marks of the workpiece, by which, furthermore, there are alignment determination systems for observing the alignment marks of the mask and the workpiece opposite the observation window parts, and by which via the observation window parts located on the workpiece carrier, the alignment marks on the back of the workpiece are observed.

(4) Automatic alignment of the workpiece on the back of which alignment marks are recorded can be achieved by the measure by which, in the projection exposure device described above in step (3), there are an image processing means and a control member means by which the imaging positions of the projected images of the mask are determined and stored, by which the positions of the alignment marks recorded on the back of the workpiece are determined, and by which the workpiece carrier is moved such that the alignment marks of the mask and workpiece come to rest on top of one another.

It is to be understood that although preferred embodiments of the invention has been described, various other embodiments and variations may occur to those skilled in the art. Any such other embodiments and variations which fall within the scope and spirit of the present invention are intended to be covered by the following claims.

What we claim is:

1. Process for projection exposure using an exposure light irradiation device for emitting exposure light, a mask on which a mask pattern and alignment marks are recorded, a projection lens, a workpiece, on a back of which (relative to an exposure surface) alignment marks are recorded, and alignment determination systems for determining the positions of the alignment marks of the mask and the workpiece and for positioning of the mask and workpiece relative to one another by positioning of the alignment marks of the mask relative to the alignment marks of the workpiece, comprising the following process steps:

(a) determining positions of the alignment marks of the mask by means of exposure light from the exposure light irradiation device, in a state in which the workpiece is not present, and in which imaging positions of the mask pattern and the alignment marks agree with focal positions of the alignment determination systems;

(b) determining positions of the alignment marks of the workpiece in a state in which the workpiece is in place, and in which the alignment marks of the workpiece agree with the focal positions of the alignment determination systems;

(c) positioning of the alignment marks of the mask relative to the alignment marks of the workpiece based on the determined positions of the alignment marks of the mask and the workpiece; and (d) bringing the exposure surface of the workpiece into agreement with the imaging positions of the mask pattern and the alignment marks;

(e) projecting the mask pattern onto the workpiece with exposure light from the exposure light irradiation device via the mask and the projection lens, and exposing the workpiece.

2. Process for projection exposure using an exposure light irradiation device for emitting exposure light, a mask on which a mask pattern and alignment marks are recorded, a projection lens, a workpiece, on a back of which (relative to an exposure surface) alignment marks are recorded, and alignment determination systems for determining the positions of the alignment marks of the mask and the workpiece and for positioning of the mask and workpiece relative to one another by positioning of the alignment marks of the mask relative to the alignment marks of the workpiece, comprising the following process steps:

(a) bringing imaging positions of the mask pattern and the alignment marks into agreement with focal positions of the alignment determination systems without the workpiece being present, picking up projected images of the alignment marks of the mask which are located in said imaging positions by means of exposure light from the exposure light irradiation device, and subjecting the images picked-up to image processing, and determining positions of the alignment marks of the mask;

(b) placing the workpiece and moving it in a direction perpendicular to its exposure surface, bringing the alignment marks of the workpiece into agreement with the focal positions of the alignment determination systems, with the workpiece being moved in a manner causing the alignment marks of the mask and the workpiece come to rest on top of one another; and (c) bringing the exposure surface of the workpiece into agreement with the imaging positions of the mask pattern and the alignment marks; and (d) projecting the mask pattern onto the workpiece with exposure light from the exposure light irradiation device via the mask and the projection lens, and exposing the workpiece.

3. Process according to claim 2, wherein the alignment marks of the mask and the workpiece are brought to rest on top of one another in step (b) automatically using the positions of the alignment marks of the workpiece determined.

4. Process according to claim 2, wherein the alignment marks of the mask and the workpiece are brought to rest on top of one another in step (b) manually using displayed images of the alignment marks which are pick-up.

5. Process for projection exposure using an exposure light irradiation device for emitting exposure light, a mask on which a mask pattern and alignment marks are recorded, a projection lens, a workpiece, on a back of which (relative to an exposure surface) alignment marks are recorded, and alignment determination systems for determining the positions of the alignment marks of the mask and the workpiece and for positioning of the mask and workpiece relative to one another by positioning of the alignment marks of the mask relative to the alignment marks of the workpiece, comprising the following process steps:

(a) bringing imaging positions of the mask pattern and the alignment marks into agreement with focal positions of the alignment determination systems without the workpiece being present, picking up projected images of the alignment marks of the mask by means of exposure light from the exposure light irradiation device, and subjecting the projected images picked-up to image processing, and determining positions of the alignment marks of the mask;

(b) placing the workpiece, and moving the alignment determination systems in a direction perpendicular to the workpiece exposure surface in a manner bringing the surface of the workpiece on which the alignment marks are recorded into agreement with the focal positions of the alignment determination systems, picking up images of the alignment marks of the workpiece, subjecting the images to image processing, and determining the positions of the alignment marks of the workpiece;

(c) moving the workpiece in a manner causing the alignment marks of the mask and of the workpiece to come to rest on top of one another;

(d) bringing the exposure surface of the workpiece and the imaging position of the mask into agreement with one another; and (e) projecting the mask pattern onto the workpiece with exposure light from the exposure light irradiation device via the mask and the projection lens, and exposing the workpiece.

6. Process according to claim 5, wherein the alignment marks of the mask and the workpiece are brought to rest on top of one another in step (b) automatically using the positions of the alignment marks of the workpiece determined.

7. Process according to claim 5, wherein the alignment marks of the mask and the workpiece are brought to rest on top of one another in step (b) manually using displayed images of the alignment marks which are pick-up.

8. Process for projection exposure using an exposure light irradiation device for emitting exposure light, a mask on which a mask pattern and alignment marks are recorded, a projection lens, a workpiece, on a back of which (relative to an exposure surface) alignment marks are recorded, and alignment determination systems for determining the positions of the alignment marks of the mask and the workpiece and for positioning of the mask and workpiece relative to one another by positioning of the alignment marks of the mask relative to the alignment marks of the workpiece, comprising the following process steps:

(a) bring imaging positions of the mask pattern, the alignment marks, focal positions of the alignment determination systems and a surface of a workpiece carrier for the workpiece into agreement with one another with the workpiece not being present;

(b) projecting images of the alignment marks of the mask, picking up the projected images by means of exposure light from the exposure light irradiation device, subjecting the projected images to image processing, and determining positions of the alignment marks of the mask;

(c) placing the workpiece on the workpiece carrier, picking up images of positions of the alignment marks of the workpiece, subjecting the images to image processing, determining positions of the alignment marks of the workpiece, and moving the workpiece to cause the alignment marks of the mask and the workpiece to come to rest on top of one another;

(d) moving at least one of the mask and the projection lens in a direction perpendicular to the workpiece exposure surface, bringing the exposure surface of the workpiece and the imaging position of the mask into agreement with one another; and (e) projecting the mask pattern onto the workpiece with exposure light from the exposure light irradiation device via the mask and the projection lens, and exposing the workpiece.

9. Process according to claim 8, wherein the alignment marks of the mask and the workpiece are brought to rest on top of one another in step (c) automatically using the positions of the alignment marks of the workpiece determined.

10. Process according to claim 8, wherein the alignment marks of the mask and the workpiece are brought to rest on top of one another in step (c) manually using displayed images of the alignment marks which are pick-up.

11. Process for projection exposure using an exposure light irradiation device for emitting exposure light, a mask on which a mask pattern and alignment marks are recorded, a projection lens, a workpiece, on a back of an exposure surface of which alignment marks are recorded, and alignment determination systems for determining the positions of the alignment marks of the mask and the workpiece and for positioning of the mask and workpiece relative to one another by positioning of the alignment marks of the mask relative to the alignment marks of the workpiece, comprising the following process steps:

(a) bringing the exposure surface of the workpiece into agreement with imaging positions of the mask pattern and the alignment marks, and bringing the surface of the workpiece on which the alignment marks are recorded and focal positions of the alignment determination systems into agreement with one another without the workpiece being present in an optical path between the projection lens and imaging positions of projected images of the mask alignment marks, position correction plates which move the imaging positions of the projected images of the mask alignment marks from their actual imaging positions by a length which corresponds to a thickness of the workpiece to be exposed being inserted into the optical path;

(b) picking up the projected images of the mask alignment marks by means of exposure light from the exposure light irradiation device, subjecting the images picked-up to image processing, and determining positions of the alignment marks of the mask;

(c) removing the position correction plates;

(d) placing the workpiece and picking up projected images of positions of the alignment marks of the workpiece, subjecting them to image processing, and determining positions of the alignment marks of the workpiece;

(e) moving the workpiece in a manner causing the alignment marks of the mask and of the workpiece to come to rest on top of one another;

(f) projecting the mask pattern onto the workpiece with exposure light from the exposure light irradiation device via the mask and the projection lens, and and exposing the workpiece.

12. Process according to claim 11, wherein the alignment marks of the mask and the workpiece are brought to rest on top of one another in step (d) automatically using the positions of the alignment marks of the workpiece determined.

13. Process according to claim 11, wherein the alignment marks of the mask and the workpiece are brought to rest on top of one another in step (d) manually using displayed images of the alignment marks which are pick-up.

* * * * *